United States Patent [19]

Ogita

[11] 4,225,823
[45] Sep. 30, 1980

[54] FRONT END CIRCUITS OF FM RECEIVERS

[75] Inventor: Minoru Ogita, Hamamatsu, Japan

[73] Assignee: Nippon Gakki Seizo Kabushiki Kaisha, Hamamatsu, Japan

[21] Appl. No.: 881,277

[22] Filed: Feb. 27, 1978

[30] Foreign Application Priority Data

Feb. 26, 1977 [JP] Japan .............................. 52-22658[U]
Jun. 3, 1977 [JP] Japan .............................. 52-72388[U]

[51] Int. Cl.² .......................... H03H 7/12; H04B 1/18
[52] U.S. Cl. .................................... 455/226; 455/290
[58] Field of Search .............................. 325/315–317, 325/373, 374, 375, 376, 377, 379, 383, 454, 458, 461, 462, 344, 427, 465; 343/701, 722, 745

[56] References Cited

U.S. PATENT DOCUMENTS

| 2,512,481 | 6/1950 | Cohen | 325/315 X |
|---|---|---|---|
| 2,812,434 | 11/1957 | van der Sijde et al. | 325/317 X |
| 3,243,708 | 3/1966 | Manson | 325/317 |
| 3,389,338 | 6/1968 | Slavin | 325/316 |
| 3,469,194 | 9/1969 | Osborn | 325/373 X |
| 3,571,723 | 3/1971 | Ogusu | 325/379 X |
| 3,730,980 | 5/1973 | Kirk, Jr. | 325/461 X |
| 3,801,922 | 4/1974 | Muszkiewicz | 325/373 X |
| 3,882,266 | 5/1975 | Walding | 325/461 X |

Primary Examiner—Benedict V. Safourek
Attorney, Agent, or Firm—Townsend and Townsend

[57] ABSTRACT

The front end circuit is constituted by first and second signal paths for transmitting a high frequency signal received by an antenna, and a transfer switch for selecting either one of the signal paths depending upon the state of the received signal, and a circuit for converting the frequency of either one of the selected signals to an intermediate frequency signal. Two signal paths have different filtering attenuating and amplifying characteristics, thereby providing an optimum condition for either a local or distant reception of radio wave signals.

10 Claims, 5 Drawing Figures

FRONT END CIRCUITS OF FM RECEIVERS

BACKGROUND OF THE INVENTION

This invention relates to an FM receiver, and more particularly to a front end circuit adapted to convert the frequency of a high frequency signal such as VHF received by an input antenna of an FM superheterodyne receiver to an intermediate frequency signal.

The front end circuit is required to have an input circuit which converts the antenna impedance into a suitable value, a high frequency filter circuit having a resonance frequency for filtering the output signal of the input circuit, and an amplifier having a suitable gain. As is well known in the art the front end circuit primarily determines those characteristics of the FM receiver such as sensitivity, S/N ratio, selectivity and spurious response, so that the design of this circuit is important. It is essential to design the front end circuit such that its loss should be small as far as possible to have a good sensitivity when the received electric field intensity is large. However, when the received electric field intensity is small or when the receiver is used in a place where interference signals are present, it is necessary to improve the selectivity to suppress unwanted waves as far as possible. More particularly, in order to improve the spurious response characteristic, it is necessary to increase the Q of the resonance circuit of the high frequency filter and to increase the degree of selectivity by increasing the number of stages of the filter. However, this requirement for a good selectivity in the front end is generally a bar to a small loss of the receiver which is necessary to provide a good sensitivity. Further, when the characteristic of the filter is made steep, the phase characteristic in the passband also varies steeply thereby degrading the fidelity characteristic of the VHF signal transmission.

For these reasons, it is necessary to design the circuit of a commercial FM receiver on a suitable compromise that can avoid various troubles described above. Accordingly, it has been necessary to use the front end circuit under conditions wherein respective elements thereof can not fully manifest their desirable characteristics so that it has been impossible to increase the sensitivity up to a limit determined by the noise figure of the amplifier. Moreover it has been impossible to improve the interference eliminating characteristic to a limit determined by the high frequency filter.

SUMMARY OF THE INVENTION

Accordingly, it is a principal object of this invention to provide a novel front end circuit of an FM receiver capable of processing high frequency signals in a manner most suitable for the condition of the received wave.

Another object of this invention is to provide an improved front end circuit of an FM receiver capable increasing the S/N ratio or the sensitivity to a limit determined by the noise figure (NF) of the amplifier.

Still another object of this invention is to provide a novel front end circuit of an FM receiver capable of improving the selectivity or the interference elimination characteristic to a limit determined by the filter construction.

According to this invention these and other objects can be accomplished by providing a front end circuit of an FM receiver of the type wherein the frequency of a high frequency signal received by an antenna is converted to obtain an intermediate frequency signal, and the intermediate frequency signal is then amplified and demodulated, characterized in that there are provided a plurality of signal processing circuits having different high frequency processing characteristics, a frequency converter for converting the outputs of the processing circuits into an intermediate frequency signal, and transfer switch means for selectively connecting either one of the processing circuits to the input of the frequency converter depending upon the state of the received high frequency signal.

DESCRIPTION OF THE PREFERRED EMBODIMENTS

Figure 1:
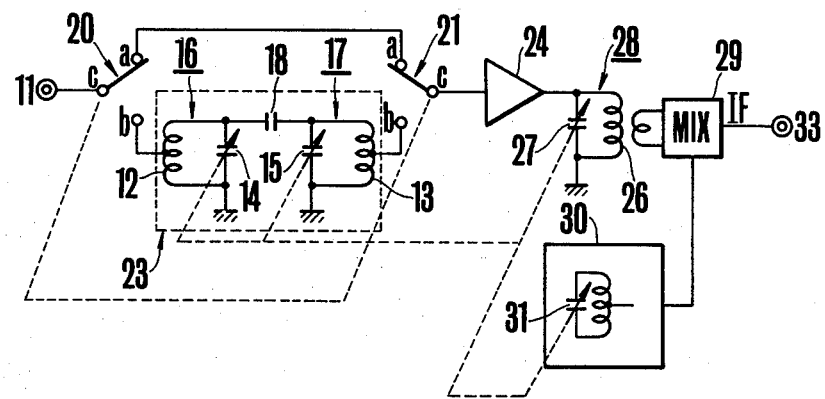
FIG. 1 is a circuit diagram showing one embodiment of the front end circuit of an FM receiver embodying the invention.

A preferred embodiment of the front end circuit of an FM receiver of this invention shown in FIG. 1 comprises an input terminal 11 for receiving a high frequency signal through an antenna, not shown, e.g. a VHF signal, coils 12 and 13, variable capacitors 14 and 15 connected in parallel with coils 12 and 13 respectively to form resonance or tuning circuits 16 and 17, a coupling capacitor 18 for intercoupling the resonance circuits, to constitute a double-tuned high frequency filter 23, and transfer switches 20 and 21 provided on the input and output sides of the high frequency filter 23, respectively, for switching the signal paths depending upon the conditions of the received wave, the transfer switches being interlocked with each other as shown by dotted lines. An input circuit including an antenna coil or any suitable filter may be added between the antenna and the input terminal 11. The movable contact c of the transfer switch 20 is connected to the input terminal 11 while the movable contact c of the transfer switch 21 is connected to an amplifier 24. The output of this amplifier is connected to a single-tuned filter unit 28 comprising a coil 26 and a variable capacitor 27 and acting as an interstage coupler, and the output of filter unit 28 is connected to the input terminal of a mixer 29 acting as a frequency converting circuit. The stationary contacts a of the transfer switches 20 and 21 are directly interconnected. The stationary contact b of the transfer switch 20 is connected to an intermediate point of the coil 12 of the high frequency filter 16 while the stationary contact b of the transfer switch 21 is connected to an intermediate point of the coil 13 of the high frequency filter 17. A local oscillator 30 forms a portion of the frequency converter or mixer 29 and a variable capacitor 31 of the local oscillator 30 is interlocked with the variable capacitors 14, 15 and 27 of the filters 16, 17 and 28.

The front end circuit described above operates as follows.

When the movable contacts c of the transfer switches 20 and 21 are thrown to their stationary contacts a, the VHF signal received by the input terminal 11 is applied directly to amplifier 24 and amplified thereby. The output of the amplifier 24 is applied to the mixer 29 through the interstage coupling filter 28 to be mixed with the high frequency output of the local oscillator 30 thereby producing an intermediate frequency signal IF at an output terminal 33 corresponding to the difference or sum of in the frequencies of both inputs to the mixer.

On the otherhand, when the movable contacts c of both transfer switches 20 and 21 are thrown to their stationary contacts b, the VHF signal applied to the input terminal 11 is supplied to the amplifier 24 via filters 16 and 17 of the high frequency filter unit 23 and the output of amplifier 24 is applied to the mixer 29 via the interstage coupling filter 28 to be mixed with the high frequency output of the local oscillator 30 thus producing an intermediate frequency signal IF in the same manner as above described.

When the movable contacts c of both transfer switches 20 and 21 are thrown to their stationary contacts a, the high frequency filter unit 23 is excluded or cut out from the transmission path so that the high frequency signal applied to the input terminal 11 is applied directly to the amplifier 24 without passing through the high frequency filter unit 23. As a result, there is no resonance or tuned loss caused by the filters 16 and 17 and it is possible to provide a wider band characteristic for the front end circuit than in the case utilizing the filter unit 23. For this reason, it is possible to obtain a signal with good sensitivity and high fidelity. Accordingly it is possible to reproduce the received signal at a high S/N ratio under a strong field condition.

When the movable contacts c of the transfer switches 20 and 21 are thrown to their stationary contacts b, the frequency selecting function of the high frequency signal applied to the input terminal 11 is improved by filters 16 and 17 of the high frequency filter unit 23 thus improving the spurious characteristic and the selectivity. In this way, according to this embodiment, it is possible to provide different degrees of high frequency signal attenuation when the field intensity of the received signal is large and when it is small. As an example, for weak signals the attenuation may be larger by a factor of 10 dB than that for strong signals.

Thus, according to this invention, it is possible to always perform optimum processing of the high frequency signal in accordance with the condition of the received wave whereby so that the sensitivity of the amplifier of the front end circuit may be increased up to the noise figure of the amplifier. It is also possible to improve the interference eliminating characteristic of the front end circuit up to its limit.

Figure 2:
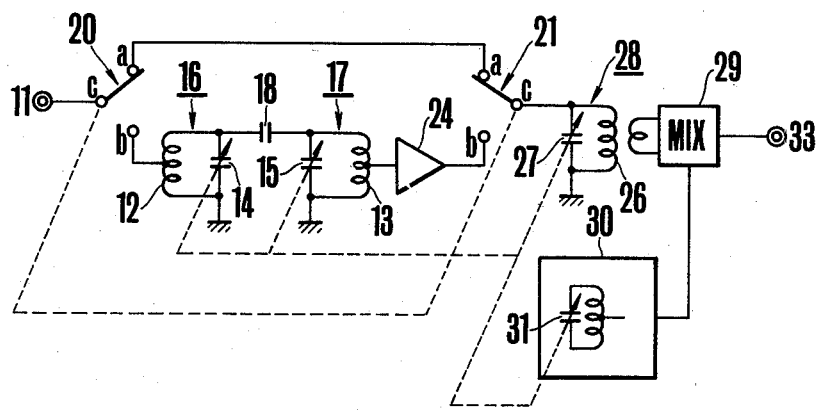
FIG. 2 is a circuit diagram showing another embodiment of the front end circuit of this invention.

In a modified embodiment of the front end circuit shown in FIG. 2, the transfer switching means for selectively changing the configuration of the front end circuit comprises transfer switches connected between an input and the mixer for selectively excluding from a transmission path both a high frequency amplifier unit and a high frequency filter serially connected to the amplifier.

In FIG. 2, elements corresponding to those shown in FIG. 1 are designated by the same reference numerals. In this modification, filters 16 and 17, and a high frequency amplifier 24 constitute a high frequency amplifier unit and the input terminal of the filter 16 is connected to the stationary contact b of the transfer switch 20. The output of the filter 17 is connected to the input of the amplifier 24 and the output of the amplifier is connected to stationary contact b of the transfer switch 21.

When the movable contacts c of the transfer switches 20 and 21 are thrown to their movable contacts a, the high frequency amplifier unit consisting of filters 16 and 17 and amplifier 24 are excluded from the transmission path so that a high frequency signal present on the input terminal 11 is applied directly to the interstage coupling filter 28 without being selectively amplified. When the movable contacts c of both transfer switches 20 and 21 are thrown to their stationary contacts b the signal applied to the input terminal 11 is selectively amplified by the filters 16 and 17 and the amplifier 24 of the high frequency amplifier unit and the output thereof is applied to the interstage coupling filter 28.

Figure 3:
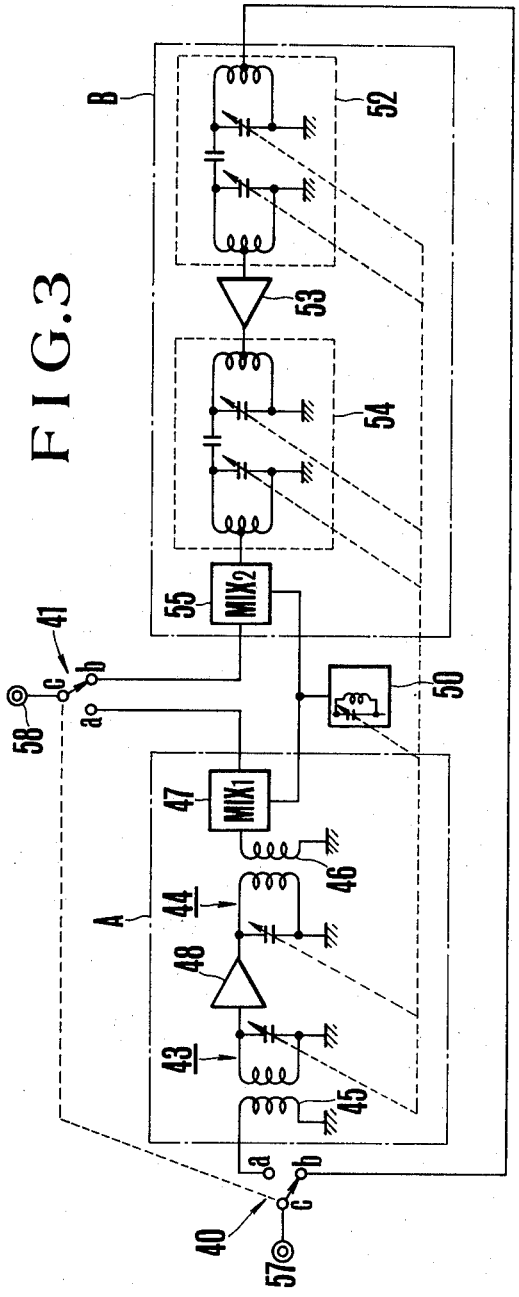
FIG. 3 is a circuit diagram showing a still further embodiment of the front end circuit of this invention.

In a still further embodiment of this invention shown in FIG. 3, there are provided a block A utilizing a single-tuned circuit on the input and output of a high frequency amplifier and a block B utilizing double-tuned circuits on the input and output of a high frequency amplifier. Both blocks A and B are switched simultaneously by interlocked transfer switches 40 and 41 which correspond to transfer switches 20 and 21 shown in FIGS. 1 and 2. The block A contains two single-tuned filters 43 and 44 which constitute a high frequency filter stage. The circuit shown in FIG. 3 is different from that shown in FIG. 1 in that coils 45 and 46 different from resonance coils are used for the coupling to the preceding and succeeding stages. One end of coil 45 is connected to the stationary contact a of the transfer switch 40 while the other end is grounded. One end of the coil 46 is connected to the input of a mixer 47 whereas the other end is grounded. Filter 43 is connected to filter 44 through amplifier 48, and the mixer 47 admixes the output of the filter 44 with the output of a local oscillator 50 to produce an intermediate frequency signal which is applied to the stationary contact a of the transfer switch 41.

Block B comprises two double-tuned high frequency filter units 52 and 54 each identical to that shown in FIG. 1. The input side of high frequency filter unit 52 is connected to the stationary contact b of the transfer switch 40, whereas the output side of the high frequency filter unit 52 is connected to the input side of the high frequency filter unit 54 of the succeeding stage through amplifier 53. The output side of the high frequency filter unit 54 is connected to the input side of a mixer 55. Mixer 55 mixes, the output of the high frequency filter unit 54 with the high frequency output of the local oscillator 50 which is also used by the block A to produce an intermediate frequency signal. The reason for providing independent mixers for blocks A and B is to provide optimum mixing operations for respective bands since signals are processed in different bands. The variable capacitors of blocks A and B and of the local oscillator 50 comprise gang capacitors. Signals received by an antenna, not shown, are applied to an input terminal 57 which is connected to the movable contact c of the transfer switch 40 and the intermediate frequency signal is sent to an intermediate frequency stage, not shown, through an output terminal 58 connected to the movable contact c of the transfer switch 41.

The operation of the modification shown in FIG. 3 is as follows. The transmission path of block A will firstly be described. When the movable contacts c of the transfer switches 40 and 41 are thrown to the stationary contacts a, the VHF signal impressed upon the input terminal 57 is applied to amplifier 48 via contacts c and a of the transfer switch 40 and the output of amplifier 48 is applied to the mixer 47 via filter 44 to be mixed with the high frequency output of the local oscillator 50 to produce an intermediate frequency signal. This signal is supplied to the output terminal 58 via contacts a and c of the transfer switch 41. Where the block A is selected, the received signal is applied to mixer 47 through the single tuned high frequency filter circuit so that this block is suited for a strong wave reception.

With reference now to the transmission path of block B, when the movable contacts c of transfer switches 40 and 41 are thrown to their stationary contacts b, the VHF signal applied to the input terminal 57 is applied to the amplifier 53 through contacts c and a of the transfer switch 40 and the high frequency filter unit 52, and the output of amplifier 53 is applied to the mixer 55 via the high frequency filter unit 54 and admixed with the high frequency output of the local oscillator 50 to produce an intermediate frequency signal which is sent to the output terminal 58 through the contacts b and c of the transfer switch 41. When block B is selected in this manner, as the high frequency signal impressed upon the input terminal 57 is applied to the mixer 55 through double tuned circuit connected to the input and output sides of the high frequency amplifier stage, the selection characteristic can be improved. Accordingly, this block is suitable for high selectivity reception of a weak wave.

Where the local oscillator 50 is used commonly for both blocks it is possible to simplify the construction of the front end circuit incorporated with a plurality of mixers and to readily adjust the resonance frequency relationship between the local oscillator 50 and high frequency filters 43, 44, 52 and 54.

Figure 4:
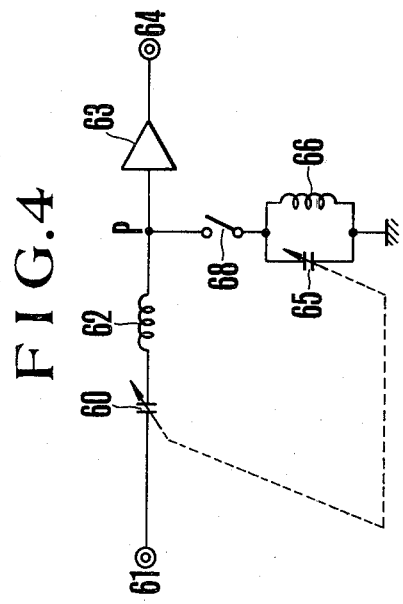
FIG. 4 is a circuit diagram showing another embodiment of the front end circuit utilizing a filter circuit comprising a series resonance circuit and a parallel resonance circuit and FIG. 5 is a circuit diagram showing yet another embodiment of this invention.

FIG. 4 shows a portion of a still further modification of this invention in which the construction of a filter is changed. One end of a variable capacitor 60 is connected to an input terminal 61 and the other end is connected to a coil 62 to form a series resonance circuit. The output of the series resonance circuit is connected to an output terminal 64 through an amplifier 63. A variable capacitor 65 ganged with the variable capacitor 60 is connected in parallel with a coil 66 to form a parallel resonance circuit. One end of this parallel resonance circuit is connected to the juncture P between coil 62 and amplifier 63 via switch 68 whereas the other end is grounded.

An input signal applied to the input terminal 61 passes through the series resonance circuit made up of variable capacitor 60 and coil 62 to the amplifier 63. The amplified output is applied to the output terminal 64. When switch 68 is closed the output of the coil 62 is subjected to the parallel resonance action provided by the variable capacitor 65 and the coil 66. Thus the frequency selection characteristic is made sharper.

The outputs of the series and parallel resonance circuits are sent to the output terminal 64 through amplifier 63.

Figure 5:
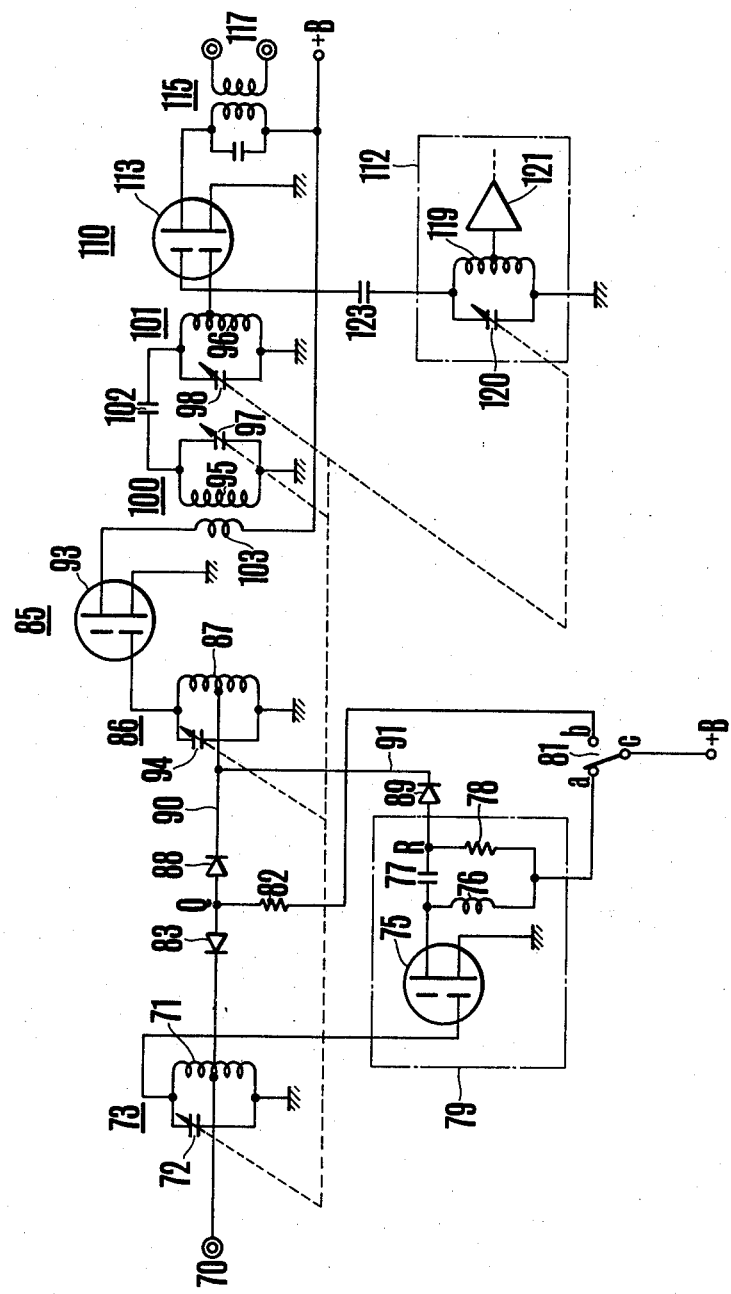

Yet another modification of the front end circuit of this invention shown in FIG. 5 comprises an input terminal 70 supplied with a VHF signal received by an antenna, not shown, and an antenna input circuit 73 acting as a high frequency filter and comprising a coil 71 (antenna coil) having an intermediate point connected to the input terminal 70 and a variable capacitor 72 connected in parallel with the coil 71. There is also provided a booster amplifier 79 including an amplifying element and a filter element and comprising an MOS type field effect transistor 75, a coil 76, a capacitor 77 and a resistor 78. The booster amplifier 79 is connected in a signal path extending between the input terminal and a high frequency amplifier described below. A transfer switch 81 is provided to select a suitable signal path depending upon the state of the received wave. The movable contact c of the transfer switch 81 is connected to a positive voltage source +B, the stationary contact a is connected to the juncture between the coil 76 and the resistor 78 of the booster amplifier 79, and the stationary contact b is connected to the juncture Q between the anode electrodes of a pair of diodes 83 and 88 through a resistor 82. The cathode electrode of the diode 83 is connected to an intermediate point of coil 71 of the resonance circuit 73 whereas the cathode electrode of the other diode 88 is connected to an intermediate point of a coil 87 of a resonance or tuning circuit 86 connected to the input of a high frequency amplifier 85. The juncture R between resistor 78 and capacitor 77 of the booster amplifier 79 is connected to the intermediate point of coil 87 of the resonance circuit 86 through diode 89. The input signal supplied from the antenna is selectively sent to the high frequency amplifier 85 through a first signal path 90 including the diodes 83 and 88 and through a second signal path 91 including booster amplifier 79.

The high frequency amplifier 85 comprises an MOS type field effect transistor 93 with its input connected to the single tuning circuit 86 made up of the coil 87 and a variable capacitor 94 connected in parallel with the coil and the output is connected to two resonance or tuning circuits 100 and 101 respectively constituted by coils 95 and 96 and variable capacitors 97 and 98 connected in parallel therewith. These two resonance circuits are coupled together by a coupling capacitor 102. One end of a coupling coil 103 for the resonance circuit 100 is connected to the output of the amplifier 85 while the other end is connected to the positive voltage source +B.

There is also provided a mixer 110 constituted by an MOS type field effect transistor 113 having inputs connected to receive the output of the resonance circuit 101 on the output side of the high frequency amplifier 85 and the high frequency output of a local oscillator 112. The output of the mixer 110 is applied to the input of an intermediate frequency transformer 115. The secondary winding thereof is connected to output terminals 117, while the primary winding is connected between the output of the mixer 110 and the positive voltage source +B.

The local oscillator 112 comprises a coil 119, a resonance capacitor 120 connected in parallel with the coil, and an amplifier 121. The resonance capacitor 120 is ganged with the variable capacitors 72, 94, 97 and 98 of the resonance circuits 73, 86, 100 and 101. The output of the local oscillator 112 is supplied to the input of transistor 113 of the mixer 110 via a capacitor 123.

The embodiment shown in FIG. 5 operates as follows. When the movable contact c of the transfer switch 81 is thrown to its stationary contact a, diodes 83 and 88 are disconnected from the source +B and hence rendered non-conductive, so that the first signal circuit 90 is interrupted. However, since diode 89 is forwardly biased through resistor 78, it becomes conductive. Consequently, the VHF signal inpressed upon the input terminal is subjected to the parallel resonance afforded by the parallel resonance circuit 73 made up of variable capacitor 72 and coil 71, and the output of the parallel resonance circuit 73 is amplified by the booster amplifier 79 and the output thereof is applied through the second signal path 91 to the parallel resonance circuit 86 comprising variable capacitor 94 and the coil 87 whereby the frequency selecting characteristic is made steeper. The output of the parallel resonance circuit 86 is applied to the input of the high frequency amplifier 85 and the output thereof is applied to mixer 110 through two resonance circuits 100 and 101 which constitute an interstage coupling filter. In the mixer 110, the output is mixed with the high frequency output of the local oscillator 112 to form an intermediate frequency output signal which is applied to the output terminal 117 through the intermediate frequency transformer 115.

When the movable contact c of the transfer switch 81 is thrown to its stationary contact b the booster amplifier 79 is cut out from the transmission path so that the signal supplied to the input terminal 70 is applied directly to the high frequency amplifier 85 without passing through the booster amplifier 79 thereby broadening the bandwidth. Where a locally broadcast wave having a high input level is received, the first signal path 90 is selected to eliminate the problem caused by a strong field.

When the movable contact c of the transfer switch 81 is thrown to the stationary contact a, the booster amplifier 79 is included in the input stage of the high frequency amplifier 85 so that the signal applied to the input terminal 70 from an antenna is preamplified by the booster amplifier 79 and then amplified by the high frequency amplifier 85 so that it is possible to obtain an output having desired magnitudes with a relatively narrow bandwidth. Selection of the second signal path 91 is made when waves broadcast from remote stations and having a low input level are received to be tuned by the receiver.

Although the invention has been described with reference to some preferred embodiments wherein signal transmission paths are selected by mechanical transfer switches, it should be understood that such mechanical transfer switches can be substituted by electronic switches for automatically selecting the transmission path of the front end circuit in accordance with the condition of the received waves.

It will be clear that the invention is not limited to the specific embodiments described above and that many changes and modifications are obvious to one skilled in the art. For example, instead of connecting the booster amplifier 79 to the high frequency amplifier 85 through filter 86 as shown in FIG. 5, it is possible to connect the booster amplifier 79 to the amplifier 85 through another filter, not shown, then filter 86.

What is claimed is:

1. In a front end circuit of an FM receiver of the type wherein the frequency of a high frequency signal received from an antenna input circuit is converted to obtain an intermediate frequency signal, the improvement which comprises at least two alternate signal processing circuits having different characteristics in sensitivity and selectivity to be selected in compliance with a high frequency signal tuned by the antenna input circuit, a first one of said alternate signal processing circuits comprising means for providing relatively broader frequency band and relatively high signal to noise ratio processing for said high frequency signal, the other one of said alternate signal processing circuits comprising means for providing relatively narrower frequency band and relatively lower signal to noise ratio processing for said high frequency signal, said other one of said alternate signal processing circuits including filter means providing a relatively steeper and narrower band pass characteristic than that provided by said first one of said alternate signal processing circuits, both of said alternate signal processing circuits having band pass characteristics centered substantially about the same frequency, a frequency converter for converting the outputs of said processing circuits into an intermediate frequency signal, and transfer switch means for selectively connecting said first one of said alternate processing circuits to the input of said frequency converter when said received high frequency signal is of a relatively high intensity and for connecting said other one of said alternate signal processing circuits to the input of said frequency converter when said received high frequency signal is of a relatively low intensity, whereby the received high frequency signal is reproduced in the most suitable sensitivity and selectivity.

2. A front end circuit according to claim 1 wherein said signal processing circuits provide first and second signal paths, said second signal path including said filter means, and wherein said transfer switch means comprises a pair of switches respectively connected on the input and output sides of respective signal paths, each one of the switches being operative to selectively couple said received high frequency signal to either one of said signal paths and to apply to said frequency converter a signal from the signal path to which said received signal is coupled.

3. A front end circuit according to claim 2 wherein said second signal path further includes a high frequency amplifier which amplifies the output of said filter.

4. A front end circuit according to claim 2 further including a high frequency amplifier coupled between the selected one of said signal paths and said frequency converter.

5. A front end circuit according to claim 1 wherein said first one of said signal processing circuits comprises a first signal path including a first high frequency filter circuit comprising at least one single-tuned circuit, and said other one of said signal processing circuits comprises a second signal path including a second high frequency filter circuit comprising at least one double-tuned circuit; and wherein said transfer switch means comprises two switches respectively connected to the input and output sides of said signal paths, said switches being operative to selectively couple the received high frequency signal to either one of said signal paths and to apply to said frequency converter the output signals from the selected one of said signal paths.

6. A front end circuit according to claim 5 wherein each of said signal paths includes a high frequency amplifier for amplifying the signal through the signal path.

7. The front end circuit according to claim 1 wherein said signal processing circuits comprise a first path including high frequency filter constituted by a series resonance circuit for filtering the received high frequency signal and a high frequency amplifier for amplifying the output of said high frequency filter, and a second path connected to the juncture between said high frequency filter and said high frequency amplifier through said transfer switch means, said second path including a high frequency filter in the form of a parallel resonance circuit.

8. A front end circuit according to claim 1 further including a high frequency amplifier coupled to said frequency converter, and wherein said first one of said signal processing circuits comprises a first path for transmitting the received signal without amplification, and said other one of said signal processing circuits comprises a second path including a booster amplifier circuit for amplifying the received signal, and wherein said transfer switch means is operative to selectively couple said first and second paths to said high frequency amplifier.

9. A front end circuit according to claim 8, wherein said second signal path further includes a high frequency filter connected to the output of said booster amplifier.

10. A front end circuit according to claim 9 further including a high frequency filter having an output coupled to said high frequency amplifier and an input coupled to the output of said first and second signal paths.

* * * * *